United States Patent
Kawakita et al.

(10) Patent No.: US 12,213,279 B2
(45) Date of Patent: Jan. 28, 2025

(54) ELECTRONIC CONTROL DEVICE

(71) Applicant: HITACHI ASTEMO, LTD., Hitachinaka (JP)

(72) Inventors: Shinya Kawakita, Tokyo (JP); Hideyuki Sakamoto, Hitachinaka (JP); Minami Teranishi, Tokyo (JP); Miki Hiraoka, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 200 days.

(21) Appl. No.: 17/760,581

(22) PCT Filed: Jun. 18, 2020

(86) PCT No.: PCT/JP2020/024039
§ 371 (c)(1),
(2) Date: Mar. 15, 2022

(87) PCT Pub. No.: WO2021/053907
PCT Pub. Date: Mar. 25, 2021

(65) Prior Publication Data
US 2022/0346267 A1    Oct. 27, 2022

(30) Foreign Application Priority Data
Sep. 17, 2019   (JP) ................................. 2019-168842

(51) Int. Cl.
*H05K 7/20*   (2006.01)
(52) U.S. Cl.
CPC ..... *H05K 7/20172* (2013.01); *H05K 7/20145* (2013.01); *H05K 7/20154* (2013.01); *H05K 7/20409* (2013.01)

(58) Field of Classification Search
CPC .......... H05K 7/20172; H05K 7/20145; H05K 7/20154; H05K 7/20409; H05K 7/20863; H01L 23/34
See application file for complete search history.

(56) References Cited

U.S. PATENT DOCUMENTS 5,638,895 A   6/1997   Dodson
5,787,971 A * 8/1998   Dodson ................. H01L 23/467
                                                                257/E23.099
(Continued)

FOREIGN PATENT DOCUMENTS

JP   H08-316387 A   11/1996
JP      3048597 U    5/1998
(Continued)

OTHER PUBLICATIONS

English machine translation of JP 3048597 U dated Feb. 25, 1998. Downloaded on Dec. 20, 2023 (Year: 2023).*

(Continued)

*Primary Examiner* — Robert J Hoffberg
(74) *Attorney, Agent, or Firm* — Foley & Lardner LLP

(57) ABSTRACT

An electronic control device includes a base, a first fan and a second fan provided on one surface, a plurality of first heat-dissipating fins provided on the one surface in a first region including a region between first and second fans such that the plurality of first heat-dissipating fins are provided in the region between the first second fans, and a plurality of second heat-dissipating fins provided on the one surface and in a second region. The plurality of first heat-dissipating fins guide a refrigerant sent by one of the first and second fans toward a remaining one of the first and second fans in the first region, and the plurality of second heat-dissipating fins (Continued)

provided in the second region have a structure for guiding a refrigerant flowing in from the first fan or the second fan away from the first fan and the second fan.

9 Claims, 12 Drawing Sheets

(56) References Cited

U.S. PATENT DOCUMENTS

| | | | |
|---|---|---|---|
| 6,172,416 B1 | 1/2001 | Miyahara et al. | |
| 6,196,302 B1 * | 3/2001 | Chuang | H05K 7/20172 165/122 |
| 6,778,392 B2 * | 8/2004 | Chiou | G06F 1/203 361/679.48 |
| 6,804,115 B2 * | 10/2004 | Lai | G06F 1/203 165/104.34 |
| 7,869,213 B2 * | 1/2011 | Chen | G06F 1/203 361/679.54 |
| 8,854,819 B2 * | 10/2014 | Chen | H01L 23/427 165/185 |
| 2011/0199731 A1 | 8/2011 | Kuwahara | |
| 2011/0308776 A1 * | 12/2011 | Huang | H01L 23/3672 165/185 |
| 2022/0240413 A1 * | 7/2022 | Saaidi | G06F 1/20 |
| 2023/0156903 A1 * | 5/2023 | Teranishi | H05K 1/0204 361/704 |
| 2023/0328930 A1 * | 10/2023 | Lin | H05K 7/20409 361/697 |

FOREIGN PATENT DOCUMENTS

| | | | | |
|---|---|---|---|---|
| JP | H10-224061 A | | 8/1998 | |
| JP | 2005-166923 A | | 6/2005 | |
| JP | 2011-192953 A | | 9/2011 | |
| JP | 2014-204606 A | | 10/2014 | |
| KR | 20160116255 A | * | 10/2016 | ......... H05K 7/20136 |

OTHER PUBLICATIONS

International Search Report with English translation and Written Opinion issued in corresponding application No. PCT/JP2020/024039 dated Sep. 8, 2020.
Office Action issued in corresponding Japanese Application No. 2019-168842 dated Sep. 6, 2022 (11 pages).

* cited by examiner

100R1

Comparative Example

Comparative Example

Comparative Example

100R2

Comparative Example

100R2
Comparative Example

ELECTRONIC CONTROL DEVICE

TECHNICAL FIELD

The present invention relates to an electronic control device.

BACKGROUND ART

For example, electronic control devices for engine control, motor control, automatic transmission control, or the like are mounted on vehicles such as an automobile. The electronic control devices include a device provided with a semiconductor element that generates high heat. Such an electronic component that generates high heat is usually arranged between a circuit board and a casing having heat-dissipating fins.

There is known a structure in which a casing is made of a material having a high thermal conductivity such as metal, and cooling air flows between heat-dissipating fins provided in the casing by an air-cooling fan to cool heat generated in an electronic component.

Since a device becomes large if one air-cooling fan is arranged on an outer surface of a casing, there is a case where a plurality of small air-cooling fans are fixed on the casing. One of such electronic control devices using a plurality of small air-cooling fans has a structure in which pin-shaped fins for heat dissipation is provided, plate-shaped fins, which are bent in an L shape and have two side portions extending along corners, are provided at a pair of corners of a casing, and cooling air, which has been sent from an air-cooling fan and flowed out from a peripheral edge portion of the casing through a gap between the fins for heat dissipation, is returned toward the pin-shaped fins (see, for example, FIG. 7 and the like of PTL 1).

CITATION LIST

Patent Literature

PTL 1: JP H8-316387 A

SUMMARY OF INVENTION

Technical Problem

In the above cooling structure described in PTL 1, the pin-shaped fins are provided on almost the entire surface of the casing, and a large number of the pin-shaped fins are provided in order to maintain heat dissipation properties since a heat dissipation area per fin of the pin-shaped fin is smaller than that of the plate-shaped fin. Therefore, if any cooling fan of the plurality of cooling fans stops due to a failure or the like, the flow velocity decreases in the vicinity of the failed cooling fan or in a downstream region of the cooling air, and sufficient cooling air is not distributed, so that there is a possibility that it becomes difficult to suppress a temperature rise of an electronic component.

Solution to Problem

According to a first aspect of the present invention, an electronic control device includes: an electronic component; a base thermally coupled to the electronic component; a first fan and a second fan provided on one surface of the base; a plurality of first heat-dissipating fins provided on the one surface of the base and provided in a first region including a region between the first fan and the second fan; and a plurality of second heat-dissipating fins provided on the one surface of the base and provided in a second region farther from the first and second fans than the first region. The plurality of first heat-dissipating fins have a structure for guiding a refrigerant sent by one of the first fan and the second fan toward a remaining one of the first fan and the second fan in the first region. The plurality of second heat-dissipating fins formed in the second region have a structure for guiding a refrigerant flowing in from the first fan or the second fan to a side away from each of the first fan and the second fan.

According to a second aspect of the present invention, an electronic control device includes: an electronic component; a base thermally coupled to the electronic component; and a first fan and a second fan provided on one surface of the base. The base includes: a first region having a pin-shaped fin that guides a refrigerant sent by one of the first fan and the second fan toward a remaining one of the first fan and the second fan; and a second region provided with a plurality of flat fins that guide the refrigerant flowing from the first region to a side away from each of the first fan and the second fan.

Advantageous Effects of Invention

According to the present invention, it is possible to improve a heat dissipation effect when any fan of the plurality of fans fails.

Other objects, configurations, and effects which have not been described above become apparent from modes for carrying out the invention to be described hereinafter.

DESCRIPTION OF EMBODIMENTS

Figure 1:
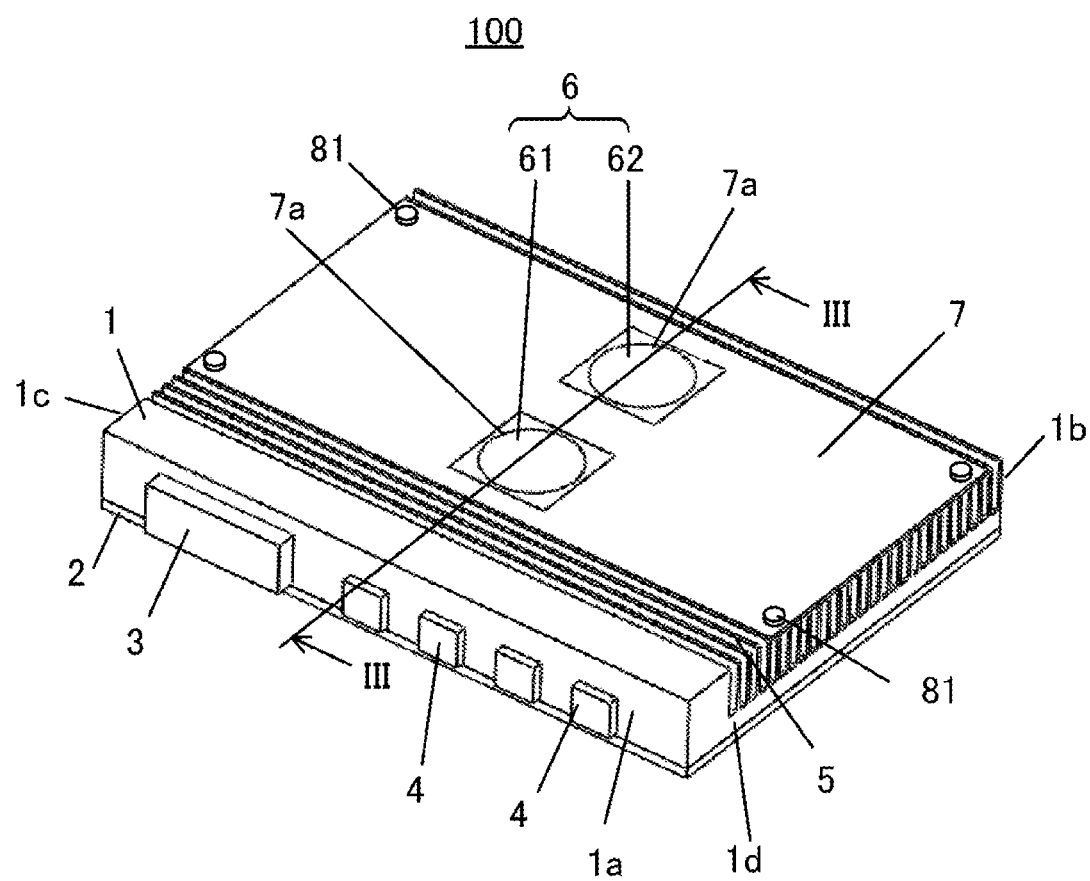
FIG. 1 is an external perspective view of an electronic control device according to a first embodiment of the present invention.

Hereinafter, embodiments of the present invention will be described with reference to the drawings. The following description and drawings are examples given to describe the present invention, and are appropriately omitted and simplified for clarification of the description. The present invention can be implemented in various other forms. Each component may be singular or plural unless specifically limited.

Positions, sizes, shapes, ranges, and the like of the respective components illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

When there are a plurality of components having the same or similar functions, the same reference sign will be sometimes described with different subscripts. When it is unnecessary to distinguish between the plurality of components, however, the subscripts will be sometimes omitted in the description.

First Embodiment

A first embodiment of an electronic control device of the present invention will be described with reference to FIGS. 1 to 8.

Figure 2:
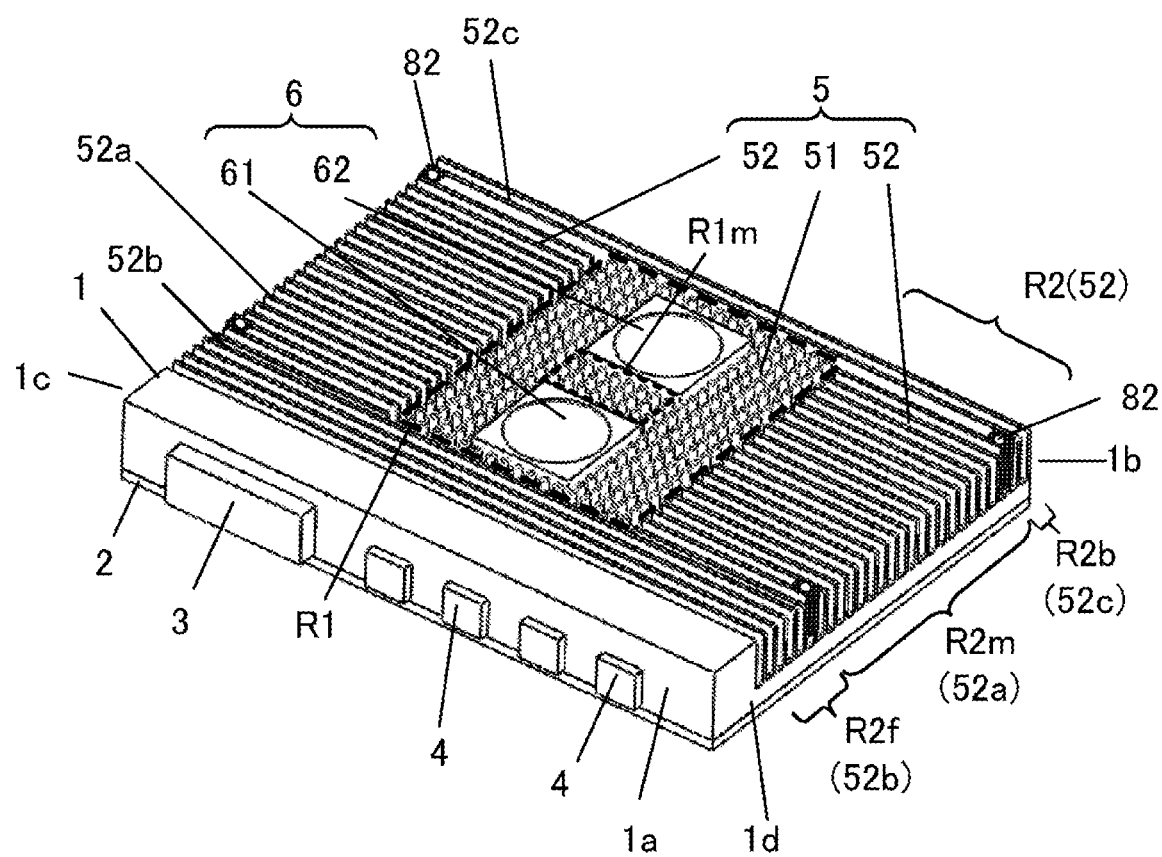
FIG. 2 is a perspective view of a state where an exterior cover of the electronic control device illustrated in FIG. 1 is removed.
Figure 3:
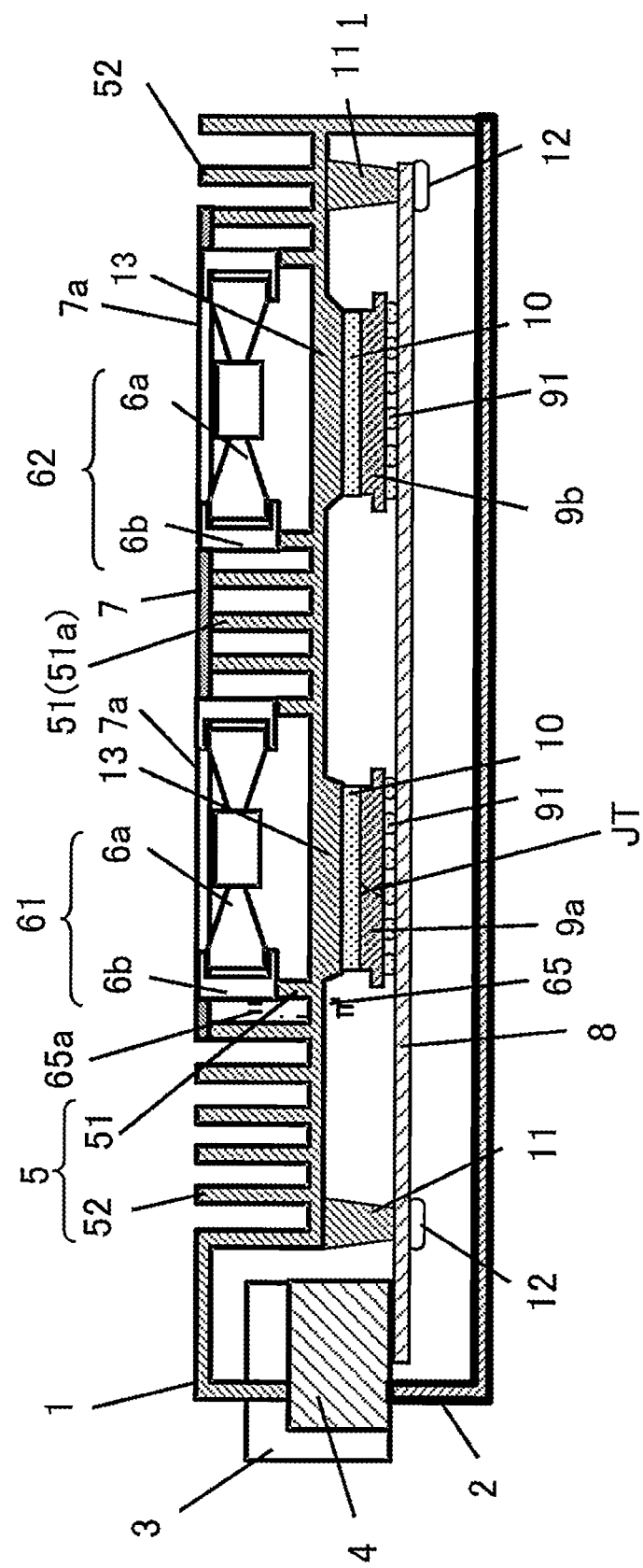
FIG. 3 is a cross-sectional view taken along line III-III of the electronic control device illustrated in FIG. 1.

FIG. 1 is an external perspective view of an electronic control device according to a first embodiment of the present invention, FIG. 2 is a perspective view of the electronic control device illustrated in FIG. 1 in a state where an exterior cover is removed, and FIG. 3 is a cross-sectional view taken along line III-III of the electronic control device illustrated in FIG. 1.

An electronic control device 100 has a box-shaped casing (see FIGS. 1 and 3) including a base 1 and a cover 2. The base 1 and the cover 2 are fixed by a fastening member such as a screw (not illustrated). A plurality of heat-dissipating fins 5 are provided on an upper surface of the base 1. In addition, the base 1 is provided with a plurality of (two in the embodiment as an example) fans 6 (see FIG. 2). The fans 6 include a first fan 61 and a second fan 62, and are fixed to the base 1 by an adhesive or a fastening member (not illustrated).

An exterior cover 7 (see FIGS. 1 and 3) is fixed to the base 1 so as to cover some of the heat-dissipating fins 5 of the base 1. The exterior cover 7 is fixed by fastening a fastening member 81 (see FIG. 1), such as a screw, which passes through an opening (not illustrated) provided in the exterior cover 7, to a fixing portion 82 (see FIG. 2) provided in each of a peripheral edge portion of the base 1, for example, four corners.

The first and second fans 61 and 62 are arranged respectively at positions shifted in a lateral direction of the base 1 at the same position in a longitudinal direction of the base 1 substantially in a central portion of the base 1 in the longitudinal direction.

A connector 3 and a plurality of (four in FIG. 1 as an example) connectors 4 for high-speed communication, such as Ethernet, are provided on a front side surface 1a of the base 1.

As illustrated in FIGS. 2 and 3, the base 1 is provided with the plurality of heat-dissipating fins 5 extending substantially in the vertical direction. The heat-dissipating fins 5 include pin-shaped heat-dissipating fins (hereinafter, also referred to as "pin-shaped fin") 51 and flat plate-shaped heat-dissipating fins (hereinafter, also referred to as "flat fin") 52. The pin-shaped fin 51 is provided in a rectangular first region R1 around the first fan 61 and the second fan 62 indicated by a dotted line in FIG. 2, and the flat fin 52 is provided in a second region R2 that occupies substantially the entire region of the base 1 outside the first region R1.

Lengths from axial centers of the first and second fans 61 and 62 to a right side end of the base 1 in the longitudinal direction (left-right direction) in the first region R1 are substantially the same. In other words, the axial centers of the first and second fans 61 and 62 are located substantially at the center of the first region R1 in the longitudinal direction (left-right direction) of the base 1. The first region R1 has a line-symmetric shape with respect to a straight line connecting the axial centers of the first and second fans 61 and 62.

In addition, lengths from the axial centers of the first and second fans 61 and 62 to an upper side end (upper side end in a short-side direction) of the first region R1 are substantially the same as lengths from the axial centers of the first and second fans 61 and 62 to a lower side end (lower side end in the short-side direction) of the first region R1.

The pin-shaped fins 51 have a columnar pin shape and are arrayed at a predetermined pitch in the longitudinal direction (left-right direction) and the lateral direction (up-down direction) of the base 1 like a grid. The pin-shaped fin 51 is also provided in a rectangular intermediate region R1$m$ between the first fan 61 and the second fan 62 indicated by a dotted line in FIG. 2.

The flat fin 52 has a strip-like rectangular shape in a plan view, and is provided in the second region R2 outside the first region R1 as described above.

The second region R2 has, in the lateral direction, a central region R2$m$ at a position shifted in the longitudinal direction at the same position as the first region R1, a front region R2$f$, and a rear region R2$b$. The central region R2$m$ is provided at a position shifted in the longitudinal direction at the same position as the first region R1 in the lateral direction of the base 1. The front region R2$f$ is provided close to the front side surface 1$a$ of the base 1 in the central region R2$m$. The rear region R2$b$ is provided close to a rear side surface 1$b$ of the base 1 in the central region R2$m$. A plurality of the flat fins 52 are arranged in parallel at substantially equal intervals in the lateral direction in each of the central region R2$m$, the front region R2$f$, and the rear region R2$b$. Each of the flat fins 52 formed in the central region R2$m$ extends from a left end of the first region R1 to a left side surface 1$c$ of the base 1 on the left side of the first region R1, and extends from a right end of the first region R1 to a right side surface 1$d$ of the base 1 on the right side of the first region R1. The flat fins 52 formed in the front region R2$f$ and the rear region R2$b$ extend substantially over the entire length in the longitudinal direction of the base 1 from the left side surface 1$c$ to the right side surface 1$d$ of the base 1.

Hereinafter, the flat fins 52 formed in the central region R2$m$, the front region R2$f$, and the rear region R2$b$ are referred to as first flat fins 52$a$, second flat fins 52$b$, and third flat fins 52$c$, respectively.

As illustrated in FIG. 1, an upper front surface of the base 1 is a flat portion, and the second flat fin 52$b$ is formed on a rear end side of the flat portion.

The exterior cover 7 is fixed to the base 1 with the first and second fans 61 and 62 exposed. The exterior cover 7 is provided with circular opening portions 7a (see FIGS. 1 and 3) at positions corresponding to the first and second fans 61 and 62. Outer peripheral edges of the first and second fans 61 and 62 are covered by the exterior cover 7. As described above, the exterior cover 7 is fixed to the fixing portion 82 of the base 1 by the fastening member 81. In addition, the first and second fans 61 and 62 are fixed to the base 1 by an adhesive or a fastening member (not illustrated).

A small gap is formed between a lower surface of the exterior cover 7 and an upper end of the pin-shaped fin 51. The gap between the exterior cover 7 and the pin-shaped fin 51 is preferably smaller than the pitch of the pin-shaped fin 51 in order to reduce the amount of cooling air leaking from the gap between the exterior cover 7 and the upper end of the pin-shaped fin 51. The lower surface of the exterior cover 7 and the upper end of the pin-shaped fin 51 may be in contact with each other.

The base 1 is formed using a member having an excellent thermal conductivity, such as aluminum (for example, ADC12).

The cover 2 is made of a material having an excellent thermal conductivity such as aluminum, which is similar to the base 1. As the cover 2 is manufactured by so-called sheet-metal using an iron-based metal material or by is formed using a material having a lower thermal conductivity with the base 1 such as a resin material, cost reduction can be achieved.

The exterior cover 7 is made of a material having an excellent thermal conductivity such as aluminum, an iron-based material, or the like.

As illustrated in FIG. 3, a first electronic component 9a, a second electronic component 9b, a thermally conductive member 10, and a circuit board 8 are accommodated in the casing including the base 1 and the cover 2. The first electronic component 9a and the second electronic component 9b are, for example, ball grid array (BGA) packages, each of which is mounted on the circuit board 8 by a bonding material 91 such as a solder ball. The circuit board 8 is fixed to an end surface of a board fixing portion 11 provided on the base 1 by a fastening member 12 such as a screw.

Although not illustrated, passive elements, such as a coil and a capacitor, are also mounted on the circuit board 8, and a wiring connecting these electronic components to the connector 3 and the high-speed communication connector 4 is also formed. The first electronic component 9a and the second electronic component 9b are, for example, system-on-a-chips (SoCs) such as a field-programmable gate array (FPGA) and a graphics processing unit (GPU) having a large amount of heat generation.

The circuit board 8 is formed of, for example, an organic material such as an epoxy resin and an inorganic material such as glass cloth. The circuit board 8 is preferably made of an FR4 material. The circuit board 8 can be configured as a single-layer board or a multilayer board.

In the connector 3 and the high-speed communication connector 4, a connector pin (not illustrated) is assembled to a connector housing, made of a thermosetting resin or metal containing glass fiber, by press fitting, insert molding, or the like. A hole or a notch for insertion of the connector 3 and the high-speed communication connector 4 is formed in a side wall on the front surface side of the base 1, and connector pins (not illustrated) of the connector 3 and the high-speed communication connector 4 are connected to the wiring (not illustrated) formed on the circuit board 8 through the hole or the notch. The connector pin and the wiring are connected by soldering, for example. Power and control signals between the outside and the electronic control device 100 and data from various sensors mounted on a vehicle are transmitted and received via the connector 3 and the high-speed communication connector 4.

Thick portions 13 protruding toward the circuit board 8 are provided at positions corresponding to the first and second electronic components 9a and 9b on an upper portion of the base 1 provided with the heat-dissipating fin 5. The heat-dissipating fin 5, the board fixing portion 11, and the thick portion 13 are integrally formed with the base 1 by casting such as die casting. However, the heat-dissipating fin 5, the board fixing portion 11, and the thick portion 13 may be manufactured as members separate from the base 1, and may be attached to the base 1 by a fastening member, welding, or the like.

The thermally conductive member 10 is interposed between the thick portion 13 and each of the first electronic component 9a and the second electronic component 9b. For the thermally conductive member 10, various types of materials, such as a grease form, a gel form, and a sheet form, are used. The thermally conductive member 10 contains a filler which is made of metal, carbon, ceramic, or the like and has a good thermal conductivity. The thermally conductive member 10 is preferably a low-elastic silicone-based resin containing a ceramic filler, for example, which has flexibility deformable with respect to deformation and vibration caused by heat of the circuit board 8 and tolerance at the time of manufacturing.

Heat emitted from the first and second electronic components 9a and 9b is conducted to the thick portion 13 of the base 1 made of a material having a good thermal conductivity via the thermally conductive member 10. The heat conducted to the thick portion 13 is conducted to the heat-dissipating fin 5 provided in the base 1 and cooled. The heat capacity of the thick portion 13 can be set to be relatively large. Therefore, the thick portion 13 absorbs the heat generated from the first and second electronic components 9a and 9b quickly, and can withstand a temporary temperature rise (transient heat) of the first and second electronic components 9a and 9b.

The pin-shaped fin 51 provided in the first region R1 is also formed in a region corresponding to the lower side of each of the first and second fans 61 and 62. The pin-shaped fin 51 formed in the region corresponding to the lower side of each of the first and second fans 61 and 62 is formed in a low-height structure whose upper side is cut off. The first fan 61 and the second fan 62 have the same structure, and each have a rotating body 6a, a motor (not illustrated), a drive board (not illustrated) having a driver circuit, and a fan case 6b.

The first fan 61 and the second fan 62 are provided at positions where at least the fans partially overlap the first and second electronic components 9a and 9b in a plan view and a cross-sectional view. It is preferable that at least a partial region of each of the first and second electronic components 9a and 9b is arranged at a position overlapping a main flow region of cooling air generated by the first fan 61 or the second fan 62.

As the fan 6, an axial fan, a centrifugal fan, or the like can be used. When an axial fan is used as the fan 6, a gap having a certain depth, for example, a gap having a depth of about half of the thickness of the fan 6 (length in the up-down direction in FIG. 3) or more is preferably provided between the fan 6 and the base 1 in order to obtain sufficient air blowing performance. On the other hand, when a centrifugal fan is used as the fan 6, the fan 6 can be mounted at a position close to a position just before the lower surface of the fan 6 comes into contact with the base 1.

The drive board (not illustrated) driving the fan 6 is connected to the circuit board 8 by a connection conductor (not illustrated). For example, as indicated by a two-dot chain line in FIG. 3, the fan 6 and the circuit board 8 may be configured such that a connector 65 penetrating the base 1 is attached to the base 1, and a pin 65*a* provided in the connector 65 is connected to each of the circuit board 8 and the fan 6 by a connection conductor (not illustrated). The connector 65 may be fixed to the fan case 6*b* of the fan 6 or may be molded integrally with the fan case 6*b*.

Referring to FIG. 2, in a state where the first and second fans 61 and 62 operate normally, the cooling air sent by the first and second fans 61 and 62 flows between all the pin-shaped fins 51 formed in the first region R1. The same applies to the inside of the intermediate region R1*m* between the first and second fans 61 and 62, and the cooling air sent by the first and second fans 61 and 62 flows between almost all the pin-shaped fins 51 provided in the intermediate region R1*m*. Wind forces of cooling air sent by the first fan 61 and cooling air sent by the second fan 62 are the same. Therefore, regarding a flow rate of the cooling air flowing between the pin-shaped fins 51, a flow rate of the cooling air sent by the first fan 61 is large in a region close to the first fan 61, and a flow rate of the cooling air sent by the second fan 62 is large in a region close to the second fan 62.

The cooling air flowing between the pin-shaped fins 51 formed in the first region R1 flows into a region between the first flat fins 52*a* formed in the central region R2*m* of the second region R2. The cooling air flowing between the first flat fins 52*a* flows in a direction away from the first and second fans 61 and 62 along a direction in which the first flat fin 52*a* extends, and flows out to the outside from the left side surface 1*c* or the right side surface 1*d* of the base 1.

A part of the cooling air flowing between the pin-shaped fins 51 formed in the first region R1 abuts on the second flat fin 52*b* formed in the front region R2*f* of the second region R2 or the third flat fin 52*c* formed in the rear region R2*b* to be restricted from traveling straight. Then, the cooling air flows in a direction away from the first and second fans 61 and 62 along a direction in which the second and third flat fins 52*b* and 52*c* extend, and flows out from the left side surface 1*c* or the right side surface 1*d* of the base 1 to the outside.

In a state where one of the first and second fans 61 and 62, for example, the second fan 62 fails and does not send the cooling air, and the other, for example, the first fan 61 is operating normally, the cooling air sent by the first fan 61 flows between the pin-shaped fins 51 in the first region R1. The heat-dissipating fin 5 formed in the intermediate region R1*m* between the first fan 61 and the second fan 62 is the pin-shaped fin 51. Therefore, the cooling air sent by the first fan 61 flows between the pin-shaped fins 51 formed in the intermediate region R1*m* and flows toward the second fan 62.

Then, the cooling air flowing toward the second fan 62 flows between the pin-shaped fins 51 formed in the first region R1 outside the intermediate region R1*m* and flows into a region between the first flat fins 52*a* formed in the central region R2*m* of the second region R2 as in a case where the second fan 62 is operating. The cooling air flowing between the first flat fins 52*a* flows in a direction away from the first and second fans 61 and 62 along a direction in which the first flat fin 52*a* extends, and flows out to the outside from the left side surface 1*c* or the right side surface 1*d* of the base 1.

This similarly applies to a state where the first fan 61 fails to send out cooling air and the second fan 62 is operating normally. In this case, the cooling air sent by second fan 62 flows between the pin-shaped fins 51 formed in the intermediate region R1*m*, and flows into the region between the first flat fins 52*a* formed in the central region R2*m* of the second region R2. The cooling air flowing between the first flat fins 52*a* flows in a direction away from the first and second fans 61 and 62 along a direction in which the first flat fin 52*a* extends, and flows out to the outside from the left side surface 1*c* or the right side surface 1*d* of the base 1.

In this manner, according to the electronic control device of the present embodiment, even in a state where one of the first and second fans 61 and 62 fails and does not operate, the electronic control device 100 can be entirely cooled by the normally operating fan, and a temperature rise can be suppressed if the other is operating normally.

Note that a plurality of the second and third flat fins 52*b* and 52*c* are formed in the front region R2*f* and the rear region R2*b*, respectively. The cooling air flowing between the pin-shaped fins 51 in the first region R1 abuts only one second flat fin 52*b* and one third flat fins 52*c* facing the first region R1 among the plurality of second and third flat fins 52*b* and 52*c*. The remaining flat fins 52*b* and 52*c* other than the one flat fin 52*b* and the one flat fin 52*c* facing the first region R1 are provided to increase a heat dissipation area of the base 1 and enhance a heat dissipation effect.

An example of a method for manufacturing the electronic control device 100 will be described.

A bonding material 91 is formed on the circuit board 8 by screen printing or the like. The first and second electronic components 9*a* and 9*b* are placed on the printed bonding material 91 by a placement machine. The resultant in this state is put into a reflow furnace. The bonding material 91 is melted and solidified during reflow to form a ball shape, and the first and second electronic components 9*a* and 9*b* are mounted on the circuit board 8. Other electronic components in addition to the first and second electronic components 9*a* and 9*b* are placed similarly to the first and second electronic components 9*a* and 9*b*, and are mounted on the circuit board 8 by reflowing at the same time as the first and second electronic components 9*a* and 9*b* or by separately performing soldering.

Next, the connector 3 and the high-speed communication connector 4 are attached to the circuit board 8. Distal ends of the connector pins (not illustrated) of the connector 3 and the high-speed communication connector 4 are made to penetrate through-vias (not illustrated) provided in the circuit board 8. In this state, the connector pin is soldered to the through-via of the circuit board 8 by a partial flow from a protruding surface side of the connector pin of the circuit board 8. This soldering can also be performed using a sleeve-type soldering robot, an iron robot, or the like. Alternatively, the distal end of the connector pin may be connected to be press-fitted into the through-via of the circuit board 8 as a press-fit pin structure. The press-fit pin has a hollow portion at a distal end portion, and the distal end portion is held in a pinhole by a restoring action when the distal end portion is press-fitted into the through-via to compress the hollow portion.

Note that the solder that connects the connector pins of the connector 3 and the high-speed communication connector 4 and through-holes may be a so-called through-hole reflow type that is supplied by printing simultaneously with the solder printing for electronic component mounting. Alternatively, a surface mounting type may be used for the connector 3 and the high-speed communication connector 4, and the connector 3 and the high-speed communication connector 4 may be soldered by reflow at the same time as the electronic components are soldered by reflow.

Meanwhile, the base 1 is made upside down from the state illustrated in FIG. 3, and the thermally conductive member 10 is applied to one surface of the thick portion 13 of the base 1. In a case where waterproofness and electromagnetic noise resistance are imparted to the electronic control device 100, a waterproof adhesive or the like may be applied to a portion where the connector 3 or the high-speed communication connector 4 is in contact with the base 1.

Next, the circuit board 8 on which the first and second electronic components 9a and 9b, the connector 3, and the high-speed communication connector 4 are mounted is fixed to the end surface of the board fixing portion 11 of the base 1 using the fastening member 12. When the circuit board 8 is fixed to the base 1, the first and second electronic components 9a and 9b are preset to be arranged at positions corresponding to the thick portions 13 of the base 1, and the first and second electronic components 9a and 9b are bonded to the thermally conductive member 10.

Thereafter, the first and second fans 61 and 62 are fixed to the base 1 and electrically connected to the circuit board 8 using a connection member (not illustrated). Then, the cover 2 is assembled to the base 1 using a fastening member (not illustrated), and the exterior cover 7 is fixed to the fixing portion 82 of the base 1 using the fastening member 81. As a result, the electronic control device 100 is obtained. Note that a waterproof adhesive or the like may be applied to a portion where the cover 2 is in contact with the base 1 in the case where the waterproofness and electromagnetic noise resistance are imparted to the electronic control device 100 as described above.

In a case where the thermally conductive member 10 and the adhesive (not illustrated) are of a thermosetting type, each member may be applied and then cured by causing the electronic control device to pass through a heating furnace.

When an adhesive is applied to a plurality of points such as portions where the connector 3 and the high-speed communication connector 4 are in contact with the base 1 and a portion where the cover 2 is in contact with the base 1 to impart waterproofness and electromagnetic noise resistance, a one-time heating step may be provided finally to simultaneously cure the adhesive.

Example 1

The electronic control device 100 having the appearance and structure illustrated in FIGS. 1 to 3 was manufactured using the following members. Note that the circuit board 8 was fixed to the board fixing portions 11 provided at the four corners of the base 1 by the fastening members 12.

FPGAs as BGA packages were used as the first and second electronic components 9a and 9b. Each of the BGA packages had a total of 224 solder balls at a pitch of 0.8 mm as the bonding material 91, and these BGA packages were mounted on the circuit board 8 by soldering. Areas of the first and second electronic components 9a and 9b are 23 mm×23 mm. A material of the bonding material 91 is Sn-3.0Ag-0.5Cu (unit: wt %).

The circuit board 8 was made of an FR4 material having an area of 200 mm×140 mm and a thickness of 1.6 mm. An equivalent thermal conductivity of the circuit board 8 is 69 W/(m·K) in the in-plane direction and 0.45 W/(m·K) in the vertical direction.

As the base 1, ADC12 having a thermal conductivity of 96 W/(m·K) was used. Molding was performed by forging, and the heat-dissipating fins 5 (51 and 52) were also integrally molded.

The pin-shaped fins 51 provided in the base 1 had a diameter of 3 mm and a height of 22 mm, and were arranged in a grid pattern. The flat fins 52 in a region covered by the exterior cover 7 had a thickness of 2 mm and a height of 22 mm. The height of the flat fin 52 in the region covered by the exterior cover 7 is equal to the height of the pin-shaped fin 51. The flat fins 52 in a region not covered by the exterior cover 7 had a thickness of 2 mm and a height of 25 mm. A difference in the flat fins 52 between the region covered by the exterior cover 7 and the region not covered by the exterior cover 7 is only the fin height. Note that the pin-shaped fins 51 are arranged in a grid pattern, but may be arranged in a houndstooth pattern. In addition, the pin-shaped fin 51 has a perfect circular shape, but may have an elliptical shape, a semicircular shape, a polygonal shape of a triangle or more, or the like.

The exterior cover 7 was made of poly-butylene terephthalate (PBT) containing 30% of glass fiber, and had an area of 307 mm×153 mm and a thickness of 2 mm. A space of 1 mm was provided between the exterior cover 7 and the heat-dissipating fin 5. The exterior cover 7 was provided with the circular opening portions 7a having a diameter of 45 mm for insertion of the first and second fans 61 and 62. The center of the circular opening portion 7a is provided coaxially with an axial center of a rotation shaft of each of the first and second fans 61 and 62. Note that a fan guard may be provided such that other objects do not come into direct contact with the rotating bodies 6a (see FIG. 3) of the first and second fans 61 and 62 through the circular opening portions 7a.

The cover 2 was manufactured by molding a steel plate having a thermal conductivity of 65 W/(m·K) by pressing.

As the connector 3, one formed by press-fitting a connector pin made of a copper alloy having a thermal conductivity of 121 W/(m·K) into a connector body made of poly-butylene terephthalate (PBT) containing 30% of glass fiber was used. An Ethernet connector was used as the high-speed communication connector 4.

As the thermally conductive member 10, one, obtained by heating and curing a mixture material made of a silicone resin and a thermally conductive filler containing alumina as a main component, was used. The thermally conductive member 10 had a thermal conductivity of 2 W/(m·K) and a maximum thickness of 1.9 mm.

As each of the first and second fans 61 and 62, an axial fan having an area of 50 mm×50 mm and a thickness of 15 mm was used. The first and second fans 61 and 62 are of a type that blows cooling air to the heat-dissipating fins 5. A distance from lower surfaces of the first and second fans 61 and 62 to the base 1 was set to 10 mm. The two first and second fans 61 and 62 were mounted, and a distance between the centers of the first fan 61 and the second fan 62 was set to 77.5 mm. When the first fan 61 and the second fan 62 have the same radius, each of the first fan 61 and the second fan 62 is preferably arranged with a spacing equal to or more than half of the radius with respect to the fan case 6b in order to prevent interference between the first fan 61 and the second fan 62 and increase the cooling efficiency.

Comparative Example 1

Figure 4:
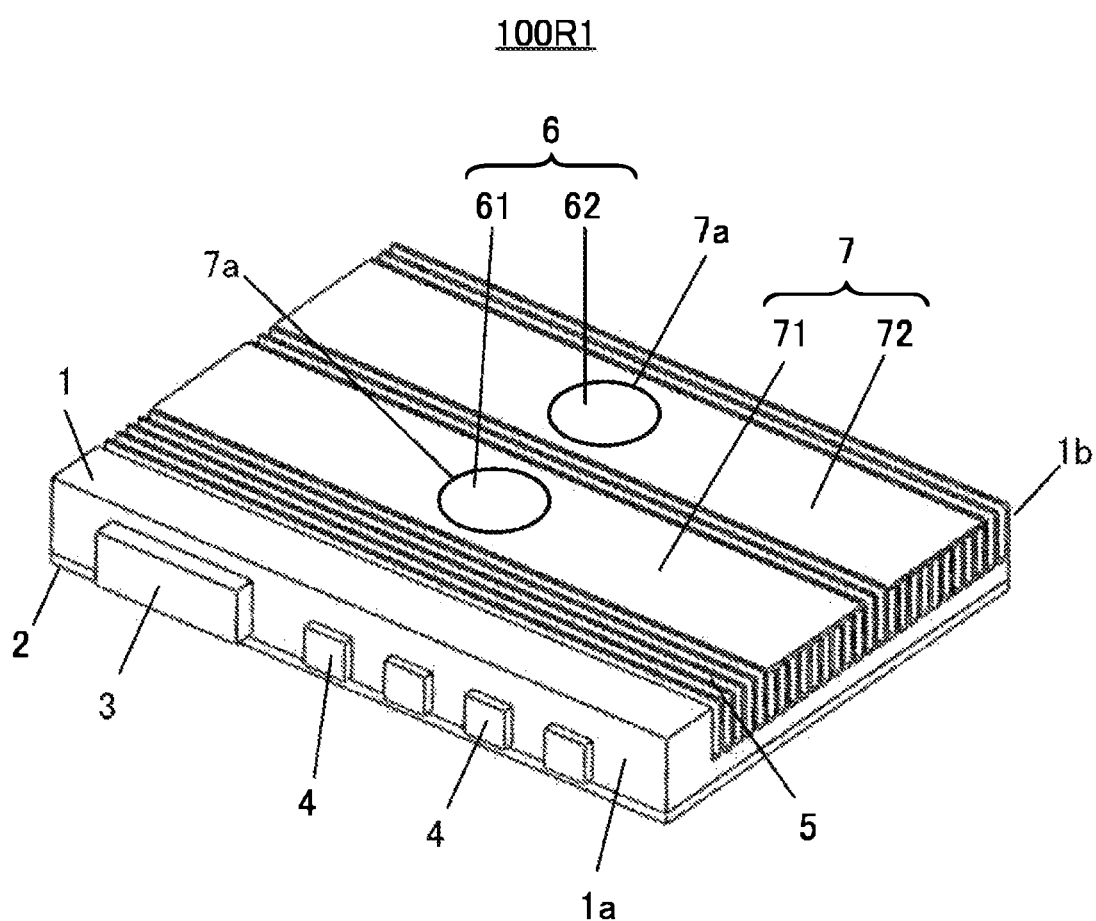
FIG. 4 is an external perspective view of an electronic control device of Comparative Example 1.
Figure 5:
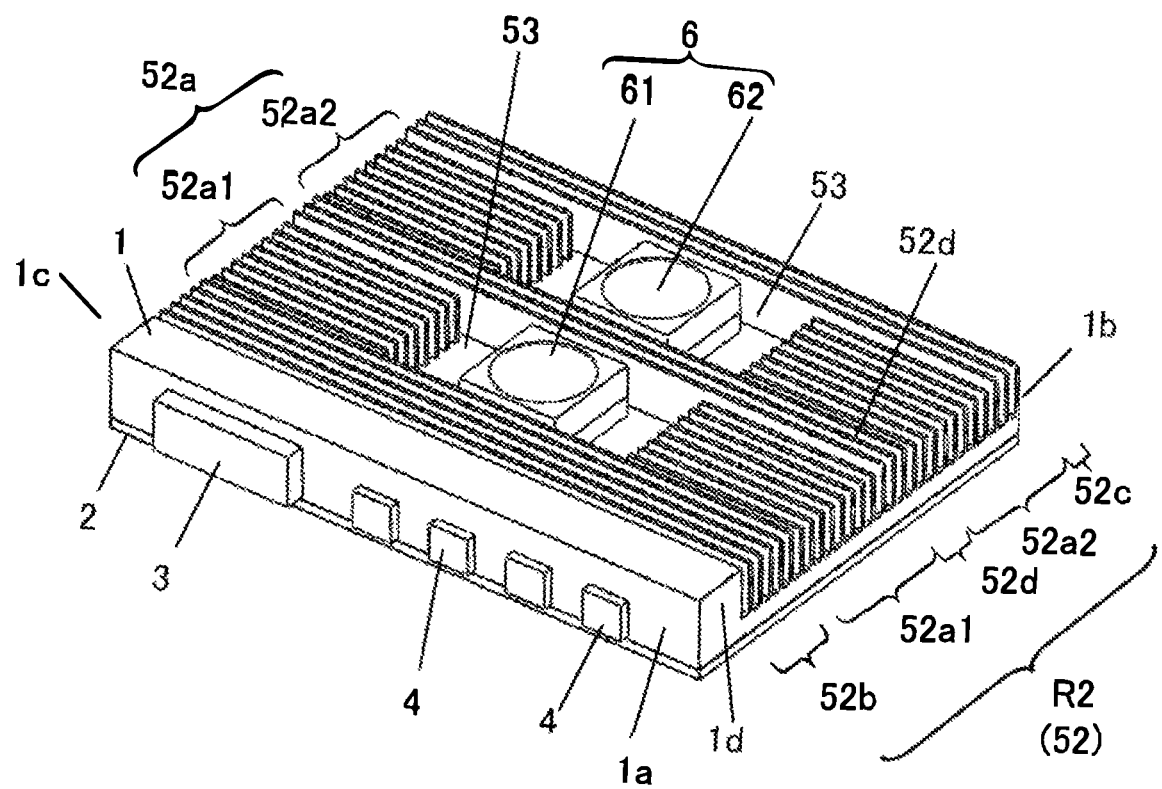
FIG. 5 is a perspective view of the electronic control device illustrated in FIG. 4 in a state where an exterior cover is removed.

FIG. 4 is an external perspective view of an electronic control device of Comparative Example 1, and FIG. 5 is a perspective view of the electronic control device illustrated in FIG. 4 in a state where an exterior cover is removed.

As illustrated in FIG. 5, in an electronic control device 100R1 of Comparative Example 1, a plurality of fourth flat fins 52d extending over the entire length in a longitudinal direction (left-right direction) of a base 1 are provided between a first fan 61 and a second fan 62. A structure in which a plurality of second flat fins 52b extending over the entire length in the longitudinal direction of the base 1 are provided on a front side surface 1a side of the base 1 and a plurality of third flat fins 52c extending over the entire length in the longitudinal direction of the base 1 are provided on a rear side surface 1b side of the base 1 is the same as that in the first embodiment. Therefore, first flat fins 52a are provided to be divided into a plurality of first flat fins 52a1, provided between the second flat fin 52b and the fourth flat fin 52d, and a plurality of first flat fins 52a2 provided between the third flat fin 52c and the fourth flat fin 52d in the electronic control device 100R1 of Comparative Example 1.

In the electronic control device 100R1 of Comparative Example 1, heat-dissipating fins 5 include only the flat fins 52, and no pin-shaped fin 51 is provided. That is, the pin-shaped fin 51 is not provided, but a space 53 is formed around each of the first and second fans 61 and 62.

In the electronic control device 100R1 of Comparative Example 1, cooling air sent by the first fan 61 abuts on the second flat fin 52b and the fourth flat fin 52d to flow between the first flat fins 52a1. That is, the cooling air sent by the first fan 61 does not flow toward the second fan 62.

In addition, cooling air sent by the second fan 62 abuts on the third flat fin 52c and the fourth flat fin 52d to flow between the first flat fins 52a2 in the electronic control device 100R1 of Comparative Example 1. That is, the cooling air sent by the second fan 62 does not flow toward the first fan 61.

In the electronic control device 100R1 of Comparative Example 1, an exterior cover 7 includes a divided exterior cover 71 provided on the first flat fin 52a1 and a divided exterior cover 72 provided on the first flat fin 52a2 as illustrated in FIG. 4.

Each of the divided exterior covers 71 and 72 had an area of 307 mm×61.5 mm and a thickness of 2 mm. A material of each of the divided exterior covers 71 and 72 is the same as that of the exterior cover 7 of Example 1. In addition, each of the divided exterior covers 71 and 72 was provided with a circular opening portion 7a having a diameter of 45 mm for insertion of the first fan 61 or the second fan 62. The center of the circular opening portion 7a is provided coaxially with an axial center of a rotation shaft of each of the first and second fans 61 and 62.

Configurations and materials of other members such as the base 1, a cover 2, a connector 3, a high-speed communication connector 4, and the first and second fans 61 and 62 are similar to those of the first embodiment.

Figure 6:
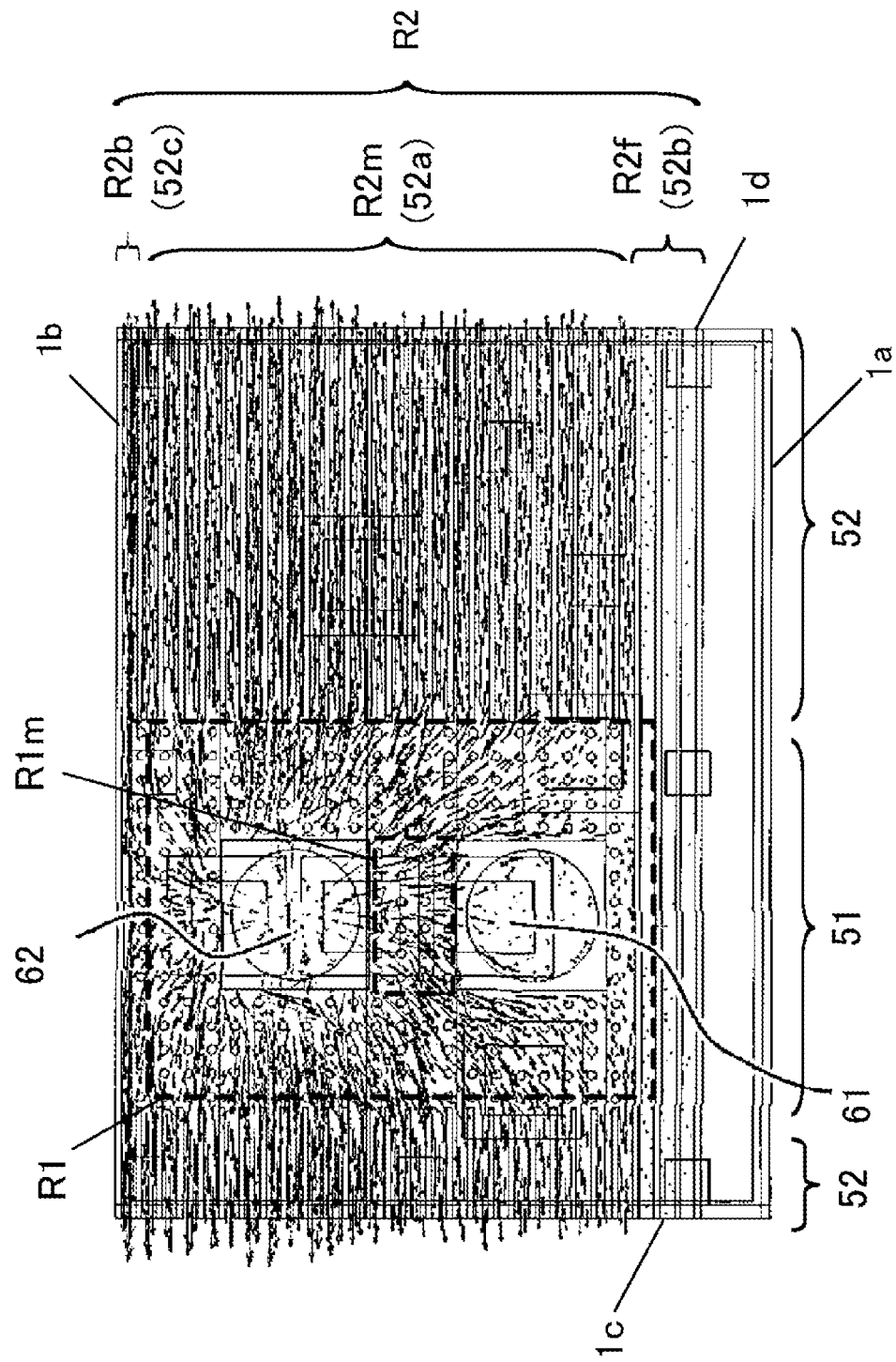
FIG. 6 is a view illustrating a flow of cooling air when one fan of the electronic control device illustrated in FIG. 1 stops.
Figure 7:
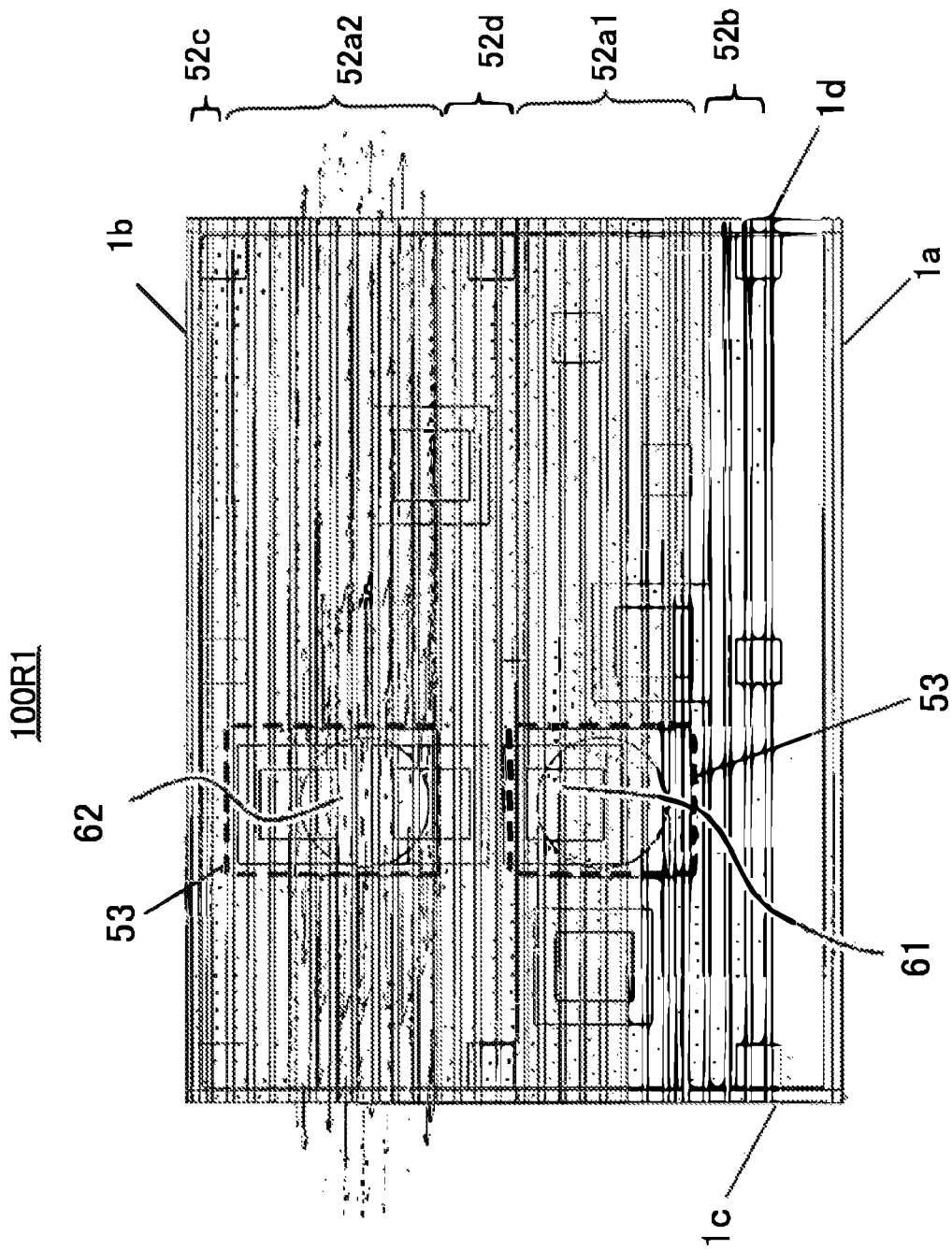
FIG. 7 is a view illustrating a flow of cooling air when one fan of the electronic control device of Comparative Example 1 illustrated in FIG. 4 stops.

FIG. 6 is a view illustrating a flow of cooling air when the first fan 61 of the electronic control device 100 illustrated in FIG. 1 stops, and FIG. 7 is a view illustrating a flow of cooling air when the first fan 61 stops in the electronic control device 100R1 of Comparative Example 1 illustrated in FIG. 4.

As illustrated in FIG. 6, even when the first fan 61 stops in the electronic control device 100 according to the first embodiment, the cooling air sent by the normally operating second fan 62 flows between the pin-shaped fins 51 formed in the first region R1 around the first and second fans 61 and 62. The cooling air sent by the second fan 62 similarly flows between the pin-shaped fins 51 even in the intermediate region R1m between the first and second fans 61 and 62. The cooling air flowing between the pin-shaped fins 51 formed in the first region R1 including the intermediate region R1m flows between the first flat fins 52a formed in the central region R2m of the second region R2. The cooling air flowing between the first flat fins 52a flows in the direction away from the first and second fans 61 and 62. In addition, the cooling air flowing between the pin-shaped fins 51 formed in the first region R1 comes into contact with the second and third flat fins 52b and 52c formed in the front and rear regions R2f and R2b of the second region R2 to be restricted from traveling straight, and flows along the second and third flat fins 52b and 52c in the direction away from the first and second fans 61 and 62.

On the other hand, in the electronic control device 100R1 of Comparative Example 1, the cooling air sent by the normally operating second fan 62 is restricted by the fourth flat fin 52d and does not flow toward the first fan 61 in a state where the first fan 61 stops as illustrated in FIG. 7. That is, the cooling air sent by the second fan 62 flows only between the first flat fins 52a2 provided closer to the second fan 62 than the fourth flat fins 52d, and does not flow between the first flat fins 52a1 provided closer to the first fan 61 than the fourth flat fins 52d.

Figure 8:
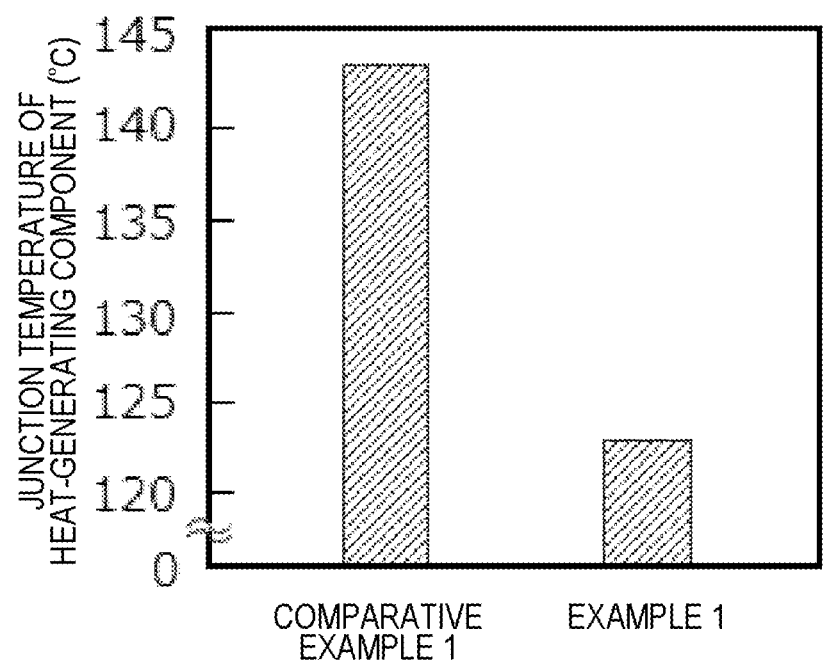
FIG. 8 is a graph illustrating junction temperatures of electronic components of Example 1 and Comparative Example 1.

FIG. 8 is a graph illustrating junction temperatures of electronic components of Example 1 and Comparative Example 1.

As illustrated in FIG. 3, the junction temperature is a temperature of a junction JT of a semiconductor element of the first electronic component 9a arranged to face the first fan 61.

The junction temperature is measured under a condition that an environmental temperature is 85° C. and the power consumption of the first and second electronic components 9a and 9b is 20 W.

As illustrated in FIG. 8, the junction temperature of the second electronic component 9b was 123° C. in the electronic control device 100 of Example 1. On the other hand, the junction temperature of the second electronic component 9b was 143° C. in the electronic control device 100R1 of Comparative Example 1.

As a result, it has been confirmed that, when one of the first and second fans 61 and 62 stopped due to a failure or the like, the junction temperature of the electronic component arranged in the vicinity of the other of the first and second fans 61 and 62 was lower in Example 1 than in Comparative Example 1.

According to the first embodiment, the following effects are obtained.

(1) The electronic control device 100 includes: the first and second electronic components 9a and 9b; the base 1 thermally coupled to the first and second electronic components 9a and 9b; the first fan 61 and the second fan 62 provided on one surface of the base 1; the plurality of pin-shaped fins (first heat-dissipating fins) 51 provided on the one surface of the base 1 and provided in the first region R1 including a region between the first fan 61 and the second fan 62; and the plurality of flat fins (second heat-dissipating fins) 52 provided on the one surface of the base 1 and provided in the second region R2 other than the first region R1. The plurality of pin-shaped fins 51 has a structure for guiding cooling air (refrigerant) sent by one of first fan 61 and second fan 62 toward a remaining one of the first fan 61 and the second fan 62 in the first region R1, and the plurality of flat fins 52 formed in the second region R2 have a structure for guiding cooling air (refrigerant) sent by the first fan 61 or the second fan 62 to a side away from the first fan 61 and the second fan 62. Therefore, even when one of the first and second fans 61 and 62 stops due to a failure or the like, the first and second electronic components 9a and 9b arranged in the vicinity of the remaining one of the first and second fans 61 and 62 can be cooled by the remaining one of the first and second fans 61 and 62. In addition, the plurality of flat fins 52 formed in the second region R2 has a structure having a larger cooling surface area than the pin-shaped fins 51, so that the heat dissipation effect can be improved. As a result, even when one of the first and second fans 61 and 62 stops, it is possible to suppress a temperature rise of the electronic components in the vicinity of the stopped fan. As a result, it is possible to extend the time until a function of the electronic control device 100 stops or to suppress the number of degenerate functions of the electronic control device 100.

(2) The flat fins 52 includes the flat fins 52a and the other flat fins 52b and 52c longer than the flat fins 52a, the flat fins 52a have a structure for guiding cooling air flowing in from the first fan 61 or the second fan 62 to a side away from the first fan 61 and the second fan 62, and the other flat fins 52b and 52c have a guide region that restrict the flow of cooling air flowing between the pin-shaped fins 51 formed in the first region R1 and guide the cooling air to a side away from the first fan 61 and the second fan 62. Since a structure where a flow path is formed between the flat fins in a downstream region where the pressure of the cooling air is weakened is provided in this manner, the stable flow can be formed even if the pressure of the cooling air is weakened, so that the heat dissipation effect can be maintained.

(3) The first fan 61 and the second fan 62 have the same radius, and the first fan 61 and the second fan 62 are arranged with a gap of half of the radius or more. Therefore, the interference between the first fan 61 and the second fan 62 can be prevented, and the cooling efficiency can be increased.

(4) The first fan 61 and the second fan 62 are axial fans, and each of the first fan 61 and the second fan 62 is arranged away from the base 1 by half of the fan thickness or more. Accordingly, sufficient air blowing performance of the axial fan can be obtained.

Second Embodiment

Figure 9:
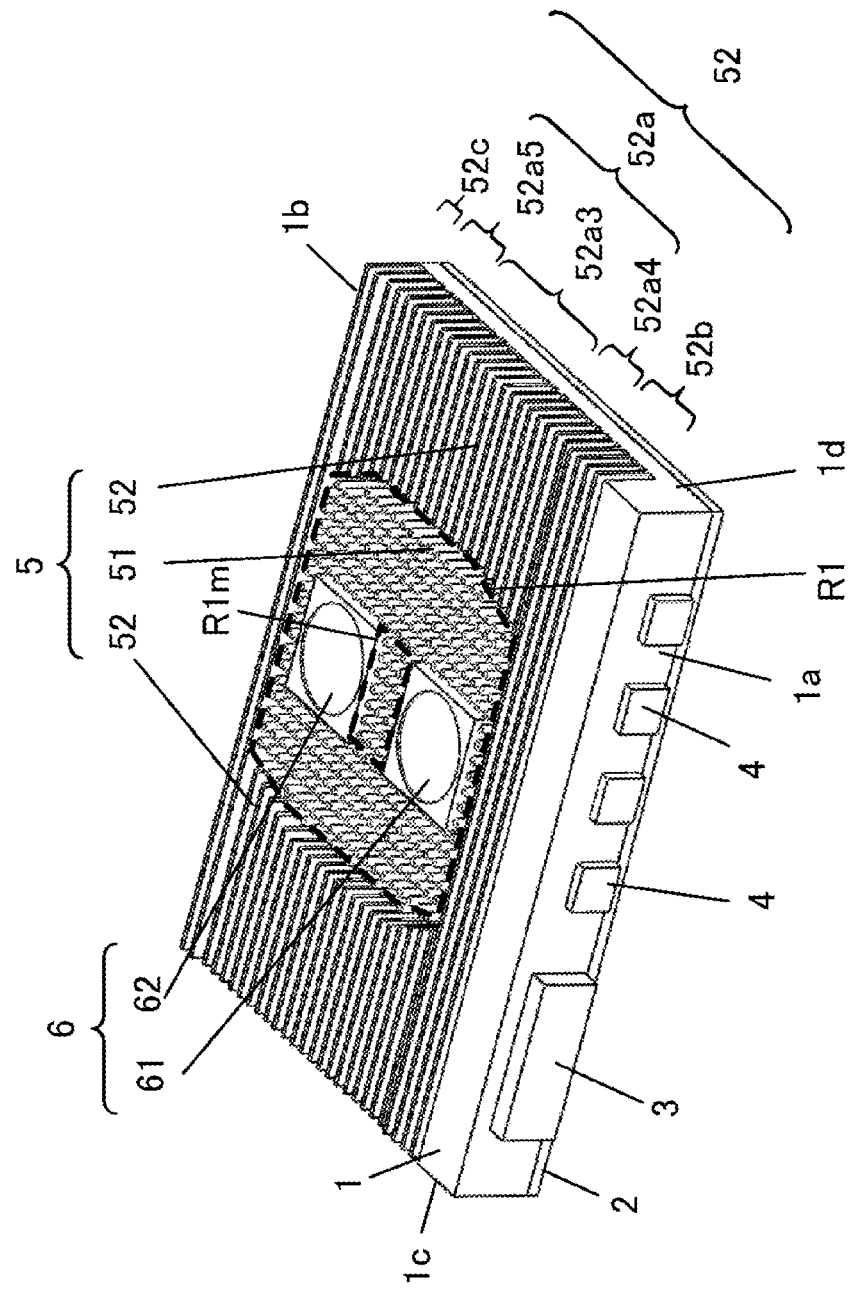
FIG. 9 is a perspective view illustrating an electronic control device according to a second embodiment of the present invention in a state where an exterior cover is removed.

FIG. 9 is a perspective view illustrating an electronic control device according to a second embodiment of the present invention in a state where an exterior cover is removed.

The second embodiment has a shape in which a left side end and a right side end in the longitudinal direction (left-right direction) of the base 1 in the first region R1 in which the first flat fins 52a are formed have substantially the same distance from the first and second fans 61 and 62, respectively.

In other words, the respective ends of the plurality of first flat fins 52a formed in the central region R2m (see FIG. 2) of the second region R2 have different lengths depending on positions in the lateral direction such that distances from the first and second fans 61 and 62 are substantially equal.

This will be described in detail.

Among the plurality of first flat fins 52a, each of a plurality of center-side flat fins 52a3 formed in a central region in the lateral direction has the same length. In other words, a left end portion of the center-side flat fin 52a3 on the left side of first and second fans 61 and 62 and a right end portion of the center-side flat fin 52a3 on the right side of the first and second fans 61 and 62 are provided at the same position in the longitudinal direction.

In addition, in a plurality of front-side flat fins 52a4 arranged close to the second flat fin 52b among the plurality of first flat fins 52a, one closer to the second flat fin 52b is longer than one farther from the second flat fin 52b. In other words, each of the front-side flat fins 52a4 is formed such that an end on the first fan 61 side has the same distance from the first fan 61.

In addition, in a plurality of rear-side flat fins 52a5 arranged close to the third flat fin 52c among the plurality of first flat fins 52a, one closer to the third flat fin 52c is longer than one farther from the third flat fin 52c. In other words, each of the rear-side flat fins 52a5 is provided such that an end on the second fan 62 side has the same distance from the second fan 62.

In this manner, the ends of the plurality of first flat fins 52a are provided at positions at which the distances from the first and second fans 61 and 62 are substantially equal in the electronic control device 100 of the second embodiment. In other words, the front-side flat fin 52a4 and the rear flat fin 52a5 are longer than center-side flat fin 52a3 in the plurality of first flat fins 52a.

Other configurations of the second embodiment are similar to those of the first embodiment, and corresponding members will be denoted by the same reference signs, and the description thereof will be omitted.

A view illustrating a flow of cooling air in a case where one fan of the electronic control device of the second embodiment stops is similar to that of the first embodiment, and thus, the illustration thereof will be omitted.

Effects (1) to (4) similar to those of the first embodiment are also obtained in the second embodiment.

Comparative Example 2

Figure 10:
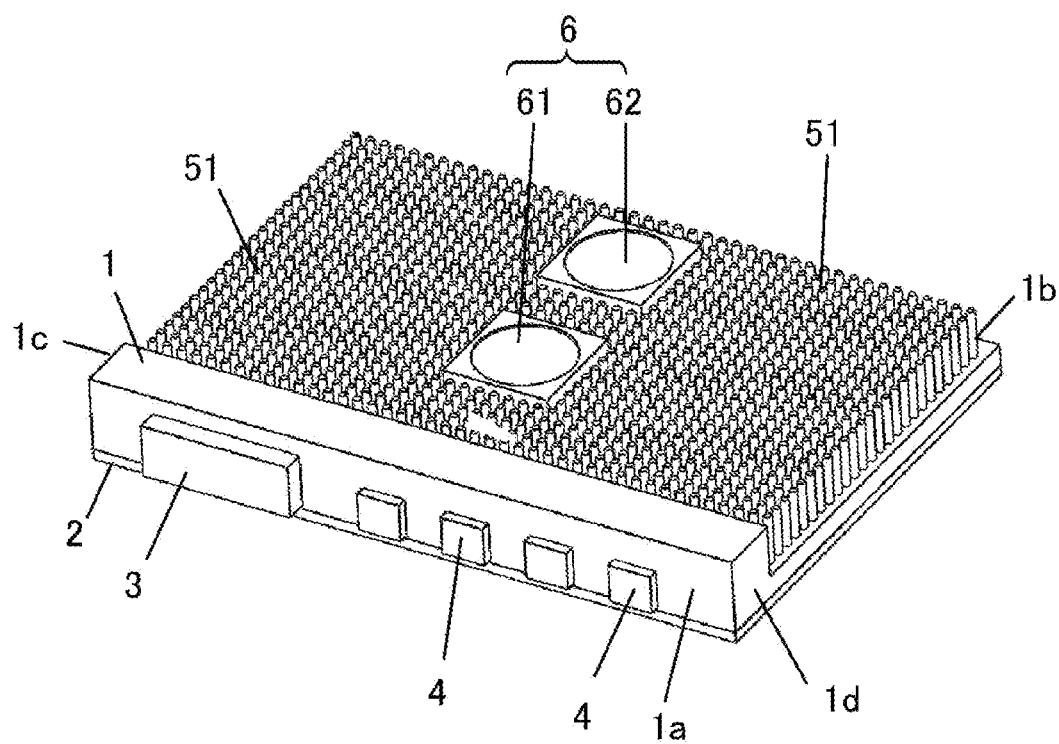
FIG. 10 is a perspective view illustrating an electronic control device of Comparative Example 2 in a state where an exterior cover is removed.
Figure 11:
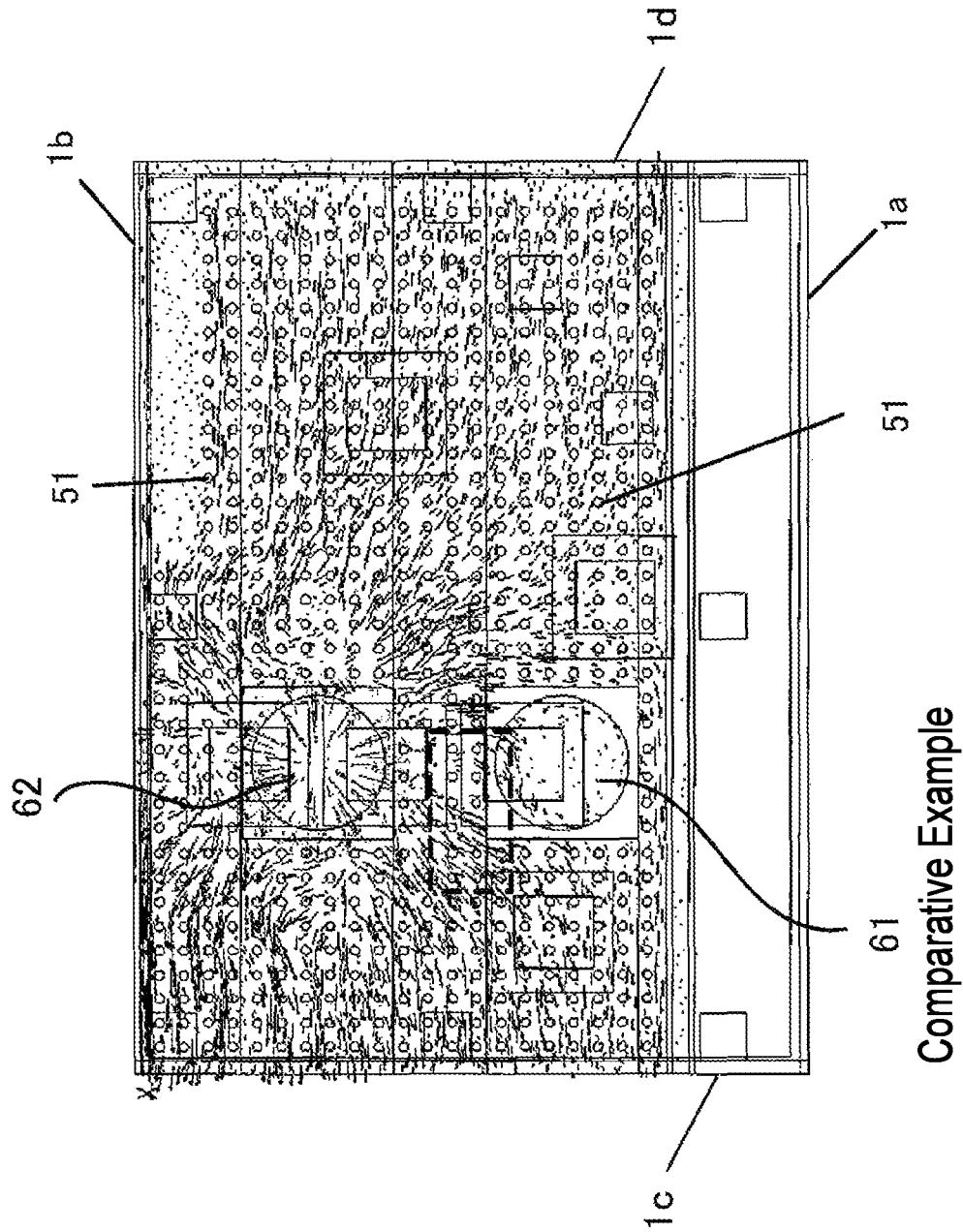
FIG. 11 is a view illustrating a flow of cooling air when one fan of the electronic control device of Comparative Example 2 illustrated in FIG. 10 stops.

FIG. 10 is a perspective view illustrating an electronic control device of Comparative Example 2 in a state where an exterior cover is removed, and FIG. 11 is a view illustrating a flow of cooling air when one fan of the electronic control device of Comparative Example 2 illustrated in FIG. 10 stops.

As illustrated in FIG. 10, an electronic control device 100R2 of Comparative Example 2 has a structure in which all of heat-dissipating fins 5 provided in a base 1 are pin-shaped fins 51.

In the electronic control device 100R2 of Comparative Example 2, the pin-shaped fins 51 are arranged in a grid pattern from the periphery of a first fan 61 and a second fan 62 to the entire surface of the base 1, and no flat fin 52 is provided.

Therefore, cooling air sent by the first and second fans 61 and 62 passes between the pin-shaped fins 51, flows in a longitudinal direction and a lateral direction of the base 1, and flows out from a peripheral edge of the base 1.

FIG. 11 illustrates the flow of cooling air from the first fan 61 in a state where the second fan 62 stops.

FIG. 11 illustrates a state where the cooling air from the first fan 61 flows toward the second fan 62, flows between the pin-shaped fins 51 arranged on the left and right sides of the second fan 62, and flows out from the peripheral edge of the base 1.

Therefore, when one of the first and second fans 61 and 62 stops, the other operating normally has an action of cooling an electronic component arranged in the vicinity of the stopped one to some extent even in the structure in which the pin-shaped fins 51 are provided on the entire surface of the base 1 as in Comparative Example 2. However, the flow in a region where the pin-shaped fin 51 is provided is likely to be turbulent than the flow in a region where the flat fin 52 is provided, and the flow velocity decreases. Therefore, a heat dissipation effect of the electronic control device 100R2 of Comparative Example 2 is smaller than that of the electronic control device 100 of the first or second embodiment including the flat fin 52.

The electronic control device 100 having the heat-dissipating fin 5 illustrated in FIG. 9 was manufactured as Example 2. The electronic control device 100 of Example 2 is similar to that of Example 1 in all of the materials, structures, and dimensions of the respective members except that the first flat fin 52a has a different configuration from that of Example 1.

Figure 12:
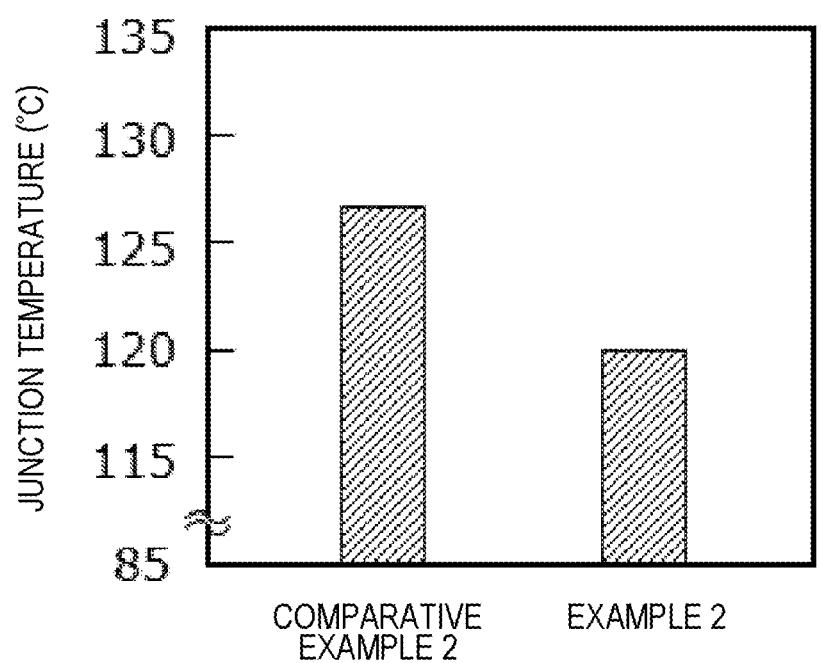
FIG. 12 is a graph illustrating junction temperatures of electronic components of Example 2 and Comparative Example 2.

FIG. 12 is a graph illustrating junction temperatures of electronic components of Example 2 and Comparative Example 2.

As illustrated in FIG. 12, the junction temperature of the second electronic component 9b was 120° C. in the electronic control device 100 of Example 2. On the other hand, the junction temperature of the second electronic component 9b was 127° C. in the electronic control device 100R2 of Comparative Example 2.

As a result, it has been confirmed that the cooling capacity of the heat-dissipating fin 5 of the electronic control device 100R2 of Comparative Example 2 was inferior to those of Example 1 and Example 2.

Note that the electronic control device 100 including the two fans 61 and 62 is exemplified in each of the above embodiments. However, the electronic control device 100 may include three or more fans.

In each of the above embodiments, the structure in which the fans 61 and 62 are provided at positions overlapping the electronic components 9a and 9b having a large heat dissipation amount in a plan view has been exemplified. However, the fans 61 and 62 may be arranged not only to face the electronic components 9a and 9b having a large heat dissipation amount but also to face other electronic components.

In each of the above embodiments, the arrangement position of the fan 6 is exemplified as the position overlapping the electronic components 9a and 9b having a large heat dissipation amount in a plan view. However, the arrangement position of the fan 6 is not necessarily the position overlapping the electronic components 9a and 9b having a large heat dissipation amount in a plan view.

In each of the above embodiments, the shape in the longitudinal direction of the first region where the pin-shaped fin 51 is provided is illustrated is to be line-symmetric with respect to the straight line connecting the axial centers of the first and second fans 61 and 62. However, the shape of the first region in the longitudinal direction is not necessarily line-symmetric.

In each of the above embodiments, the plurality of flat fins 52 has been exemplified as the structure extending in parallel from the end portions close to the first and second fans 61 and 62 toward the peripheral edge of the base 1. However, the plurality of flat fins 52 may have a structure not extending in parallel, such as extending radially, from the end portions close to the first and second fans 61 and 62 toward the peripheral edge of the base 1.

In each of the above embodiments, the structure in which all the heat-dissipating fins 5 are integrally molded with the base 1 has been exemplified. However, a region where pin-shaped fins 51 are provided and a region where flat fins 52 are provided may be formed separately as separate members.

In each of the above embodiments, the first and second electronic components 9a and 9b are exemplified as the BGA packages. However, a semiconductor package other than the BGA type package may be used in the present invention.

In each of the above embodiments, the thick portions 13 are provided in the base 1, and the first and second electronic components 9a and 9b are thermally bonded to the thick portions 13. However, the thick portion 13 is not necessarily required.

Although various embodiments and modifications have been described above, the present invention is not limited to these contents. Other aspects that can be considered within the scope of the technical ideas of the present invention are also included in the scope of the present invention.

The disclosed content of the following priority application is incorporated herein as the citation.

Japanese Patent Application No. 2019-168842 (filed on Sep. 17, 2019)

REFERENCE SIGNS LIST 1 base
5 heat-dissipating fin
6 fan
6b fan case
8 circuit board
9a first electronic component
9b second electronic component
51 pin-shaped heat-dissipating fin (first heat-dissipating fin)
52 flat plate-shaped heat-dissipating fin (second heat-dissipating fin)
52a, 52a1 to 52a5 first flat fin
52b second flat fin
52c third flat fin
52d fourth flat fin
61 first fan
62 second fan
100 electronic control device
R1 first region
R2 second region

The invention claimed is:
1. An electronic control device comprising:
an electronic component;
a base thermally coupled to the electronic component;
a first fan and a second fan provided on one surface of the base;
a plurality of first heat-dissipating fins provided on the one surface of the base and provided in a first region including an intermediate region between the first fan and the second fan such that the plurality of first heat-dissipating fins are provided in the intermediate region between the first fan and the second fan, at least one of the plurality of first heat-dissipating fins is a pin-shaped fin; and
a plurality of second heat-dissipating fins provided on the one surface of the base and provided in a second region farther from the first and second fans than the first region, at least one of the plurality of second heat-dissipating fins is at least one flat-shaped fin,
wherein the plurality of first heat-dissipating fins have a structure for guiding a refrigerant along at least a lateral axis sent by one of the first fan and the second fan toward a remaining one of the first fan and the second fan in the first region, the plurality of second heat-dissipating fins provided in the second region have a structure for guiding the refrigerant flowing along a longitudinal axis in from the first fan or the second fan to sides away from each of the first fan and the second fan, the longitudinal axis being perpendicular to the lateral axis, the first fan and the second fan are provided in the first region such that the plurality of first heat-dissipating fins are provided along the lateral axis on (i) opposing sides of the first fan and (ii) opposing sides of the second fan, and the plurality of second heat-dissipating fins are provided along (i) the longitudinal axis on opposing sides of the first region and (ii) the lateral axis on opposing sides of the first region.

2. The electronic control device according to claim 1, wherein each of the plurality of first heat-dissipating fins is the pin-shaped fin, and each of the plurality of second heat-dissipating fins is the flat fin.

3. The electronic control device according to claim 1, wherein the plurality of second heat-dissipating fins include at least another flat fin longer than the at least one flat fin, the at least one flat fin has a structure for guiding the refrigerant flowing along the longitudinal axis from the first fan or the second fan toward the sides away from each of the first fan and the second fan, and the at least another flat fin restricts a flow of the refrigerant flowing along the lateral axis between the plurality of first heat-dissipating fins provided in the first region, and guides the refrigerant to the sides away from each of the first fan and the second fan.

4. The electronic control device according to claim 1, wherein
the first fan and the second fan have an identical radius, and the first fan and the second fan are arranged apart from each other by a half of the identical radius or more.

5. The electronic control device according to claim 1, wherein
the first fan and the second fan are axial fans, the first fan and the second fan define a fan thickness, and each of the first fan and the second fan is arranged apart from the base by a half of the fan thickness or more.

6. An electronic control device comprising:
an electronic component;
a base thermally coupled to the electronic component; and
a first fan and a second fan provided on one surface of the base, wherein the base includes:
a first region having a plurality of pin-shaped fins that guide a refrigerant along at least a lateral axis sent by one of the first fan and the second fan toward a remaining one of the first fan and the second fan, the first region including an intermediate region between the first fan and the second fan such that the plurality of pin-shaped fins are provided in the intermediate region between the first fan and the second fan; and
a second region provided with a plurality of flat fins that guide the refrigerant flowing along a longitudinal axis from the first region to sides away from the first fan and the second fans, the longitudinal axis being perpendicular to the lateral axis, wherein the first fan and the second fan are provided in the first region such that the plurality of pin-shaped fins are provided along the lateral axis on (i) opposing sides of the first fan and (ii) opposing sides of the second fan, and the plurality of flat fins are provided in the second region along (i) the longitudinal axis on opposing sides of the first region and (ii) the lateral axis opposing sides of the first region.

7. The electronic control device according to claim 6, wherein the plurality of second heat-dissipating fins include at least one flat fin and at least another flat fin longer than the at least one flat fin, the at least one flat fin has a structure for guiding the refrigerant flowing along the longitudinal axis from the first fan or the second fan toward the sides away from each of the first fan and the second fan, and the at least another flat fin restricts a flow of the refrigerant flowing along the lateral axis between the plurality of first heat-dissipating fins provided in the first region, and guides the refrigerant to the sides away from each of the first fan and the second fan along the longitudinal axis.

8. The electronic control device according to claim 6, wherein the first fan and the second fan have an identical radius, and the first fan and the second fan are arranged apart from each other by a half of the identical radius or more.

9. The electronic control device according to claim 6, wherein the first fan and the second fan are axial fans, the first fan and the second fan define a fan thickness, and each of the first fan and the second fan is arranged apart from the base by a half of the fan thickness or more.

* * * * *